United States Patent
Bassett et al.

(10) Patent No.: US 6,611,337 B1
(45) Date of Patent: Aug. 26, 2003

(54) INTERFEROMETER COUPLER USING MULTIPLE INPUT PORTS FOR IMPROVED STABILITY

(75) Inventors: Ian Masson Bassett, Wollstonecraft (AU); John Herbert Haywood, East Gosford (AU)

(73) Assignee: The University of Sydney, Sydney (AU)

(*) Notice: Subject to any disclaimer, the term of this patent is extended or adjusted under 35 U.S.C. 154(b) by 0 days.

(21) Appl. No.: 09/762,869

(22) PCT Filed: Oct. 11, 1999

(86) PCT No.: PCT/AU99/00870

§ 371 (c)(1),
(2), (4) Date: Mar. 29, 2001

(87) PCT Pub. No.: WO00/22393

PCT Pub. Date: Apr. 20, 2000

(30) Foreign Application Priority Data

Oct. 9, 1998 (AU) .............................................. PP6449

(51) Int. Cl.$^7$ ................................................ G01C 19/72
(52) U.S. Cl. .................................... 356/466; 356/477
(58) Field of Search ................................ 356/477, 466, 356/478, 481, 483; 250/227.19, 227.27; 385/12

(56) References Cited

U.S. PATENT DOCUMENTS

| 4,420,258 A | | 12/1983 | Burns et al. | |
|---|---|---|---|---|
| 5,037,204 A | * | 8/1991 | Poisel et al. | ................. 356/466 |
| 5,153,677 A | | 10/1992 | Keck et al. | |
| 5,227,860 A | * | 7/1993 | Hartl et al. | ................. 356/466 |
| 5,289,256 A | | 2/1994 | Gramling | |
| 5,430,544 A | * | 7/1995 | Poisel et al. | ................. 356/466 |

* cited by examiner

*Primary Examiner*—Samuel A. Turner
(74) *Attorney, Agent, or Firm*—Ladas & Parry

(57) ABSTRACT

A method of interrogating an optical coupler interconnected to a two beam interferometer, so as to determine an idealized output value, said optical coupler having at least three bidirectional external input/output ports, said method comprising the steps of: for each of said external input/output ports: inserting an optical signal into the port; measuring a corresponding output at each of said ports; forming summations of those corresponding outputs which, in an ideal coupler, would have equal intensities; and determining said idealized output value of said coupler from said summations.

8 Claims, 2 Drawing Sheets

US 6,611,337 B1

INTERFEROMETER COUPLER USING MULTIPLE INPUT PORTS FOR IMPROVED STABILITY

FIELD OF THE INVENTION

The present invention is directed to the field of optical signal processing and in particular to the processing of interferometric signals utilising a coupler or the like.

BACKGROUND OF THE INVENTION

Sagnac interferometric techniques are often utilised in various measurement fields including optical gyroscopes and current measuring devices. For example, PCT Application No. PCT/AU92/000680 by Clarke discloses one form of current sensor device utilising interferometric techniques. These devices utilise a coupler for coupling optical signals into and out of the overall Sagnac arrangement. The basic form of a current sensor according to Clarke includes a Sagnac loop attached to a 3×3 coupler with the coupler being utilised to couple optical signals in and out of the Sagnac loop. An optical source injects light via the coupler bidirectionally around the Sagnac loop with the output on each arm of the coupler being measured by detectors.

The arrangement utilising the 3×3 coupler is used to measure rotation (gyroscope) or magnetic fields (current sensor). The arrangement is a passive interferometer in that it contains no active optical elements for modulating frequency, phase or amplitude. In such a passive system, the stability of the optical components is critical. Unfortunately, in practice the 3×3 coupler has been known to change its coupling parameters with temperature and time.

SUMMARY OF THE INVENTION

It is an object of at least preferred embodiments of the present invention to provide for an improved form of interrogating a Sagnac interferometer.

In accordance with a first aspect of the present invention, there is provided a method of interrogating an optical coupler interconnected to a two beam interferometer, so as to determine an idealised output value, said optical coupler having at least three bidirectional external input/output ports, said method comprising the steps of: for each of said external input/output ports: inserting an optical signal into the port, measuring a corresponding output at each of said ports, forming summations of those corresponding outputs which, in an ideal coupler, would have equal intensities; and determining said idealized output value of said coupler from said summations.

The optical coupler can comprise a 3×3 coupler and each of the summations can be formed from a corresponding output from each of the ports for a particular optical signal insertion.

The two beam interferometer can comprise a Sagnac interferometer.

The two beam interferometer can comprise a Michelson interferometer.

In one implementation, the summations are formed from a single optical pulse appropriately delayed so that said corresponding outputs arrive at a detector in a temporally spaced manner.

In accordance with a second aspect of the present invention there is provided an apparatus for interrogating an optical coupler interconnected to a two beam interferometer, so as to determine an idealised output value, said optical coupler having at least three bidirectional external input/output ports, said apparatus comprising: means for inserting optical signals into each of the ports; means for measuring a corresponding output at each of said ports when an optical signal is inserted into one of the ports; and means for forming summations of those corresponding outputs which, in an ideal coupler, would have equal intensities.

The apparatus may further comprise means for determining the idealised output value of the coupler from said summations.

Devices implementing the method are also disclosed.

BRIEF DESCRIPTION OF THE DRAWINGS

Notwithstanding any other forms which may fall within the scope of the present invention, preferred forms of the invention will now be described, by way of example only, with reference to the accompanying drawings in which.

DETAILED DESCRIPTION OF THE PREFERRED AND OTHER EMBODIMENTS

Figure 1:
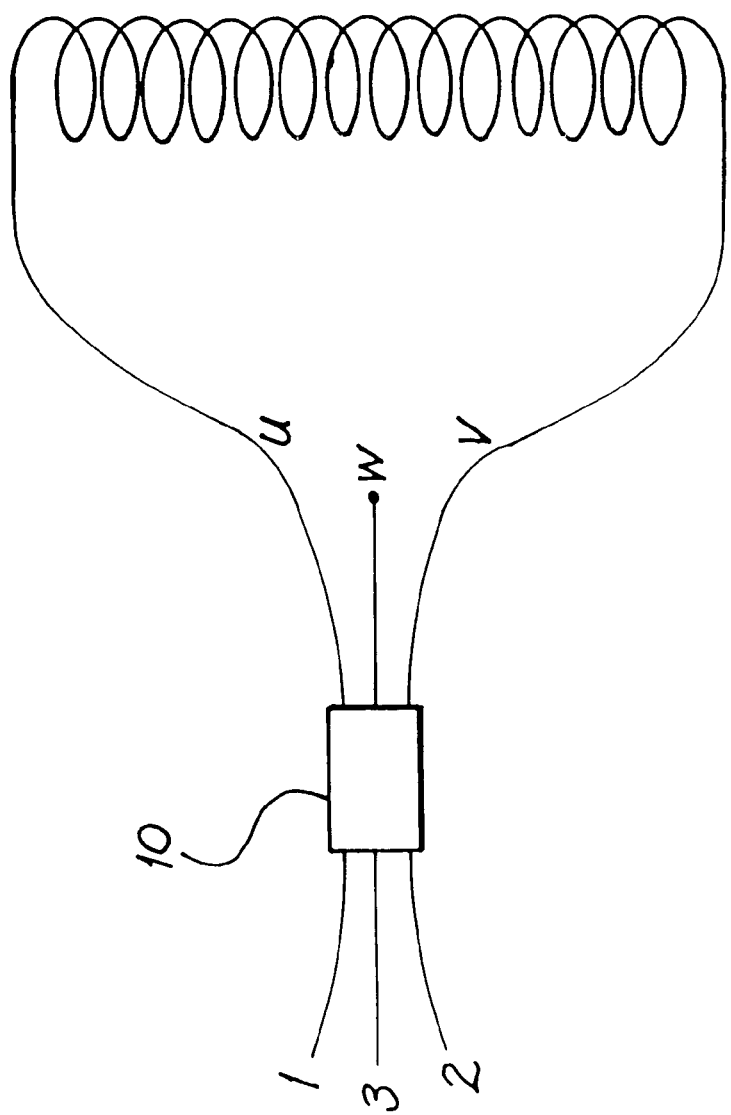
FIG. 1 illustrates the input and output ports of a 3×3 coupler of a Sagnac interferometer.

As shown in FIG. 1, in a Sagnac interferometer closed by a 3×3 coupler 10 there are three external ports labelled 1, 2 and 3 and ports u, v, w; two (u, v) of which close the Sagnac loop, while w may be unused. If the coupler 10 is ideal in the sense that it is lossless and the splitting ratios are all exactly 1/3, then any of the three external ports will do as an input port and no additional information is obtained by using more than one input port. If the coupler has small losses and the splitting ratios differ by small amounts from the ideal value 1/3, additional information can be obtained by using more than one input port.

By using all three input ports, the effects of small departures from ideal coupler parameters can be eliminated to the first order, or at least reduced to a single parameter expressing an average excess loss for the coupler. The theoretical basis of this processing is the principle of reciprocity, which connects the forward and reverse transition amplitudes in the coupler. The analysis ignores polarisation, that is, it is a scalar theory. It is however substantially applicable to a system in which polarisation filtering is employed so that there is in effect only a single polarisation state in the system.

The transfer matrix for the 3×3 coupler in the forward direction (left to right in FIG. 1) may be written as:

$$\begin{bmatrix} r_{1u}e^{i\varphi_{1u}} & r_{1v}e^{i\varphi_{1v}} & r_{1w}e^{i\varphi_{1w}} \\ r_{2u}e^{i\varphi_{2u}} & r_{2v}e^{i\varphi_{2v}} & r_{2w}e^{i\varphi_{2w}} \\ r_{3u}e^{i\varphi_{3u}} & r_{3v}e^{i\varphi_{3v}} & r_{3w}e^{i\varphi_{3w}} \end{bmatrix} \quad (1)$$

The r's and φ's are real. The transfer matrix in the opposite direction may similarly be written by interchanging numbers and letters in the subscripts. According to the principle of reciprocity, the amplitudes are equal in pairs, for example.

$$r_{2u}e^{i\phi_{2u}} = r_{u2}e^{i\phi_{u2}} \quad (2)$$

It is possible to build up expressions for the three output intensities when input is at any one of the three numbered input ports. For example if light is input at port 1 with unit intensity, the output intensity at port 2 may be obtained through the following steps:

(a) the complex amplitude for transfer from 1 to 2 in the clockwise sense around the Sagnac loop is $$r_{1u}e^{i\phi_{1u}}e^{i\psi}r_{v2}e^{i\phi_{v2}} \qquad (3)$$

(b) complex amplitude for transfer from 1 to 2 in the counter clockwise sense is $$r_{1u}e^{i\phi_{1u}}e^{-i\psi}r_{v2}e^{i\phi_{v2}} \qquad (4)$$

In the expressions 3 and 4, $\Psi$ is the phase shift produced by the rotation, or electric current passing through the loop (depending on what is being measured). The total amplitude for transfer from 1 to 2 is the sum of the clockwise and the counter clockwise amplitudes namely $$r_{1u}r_{2v}e^{i(\phi_{1u}+\phi_{2r}+\psi)}+r_{1v}r_{2u}e^{i(\phi_{1v}+\phi_{2u}-\psi)} \qquad (5)$$

where the reciprocal property (equation 2) has been used to put numbers before letters in all the subscripts. The ordinary phase shift due simply to passage through the medium is the same in the clockwise and counterclockwise sense, has no effect on the output intensities, and is omitted.

The intensity at output 2 is the squared magnitude of the expression 5, and we may write it as the intensity output at port 2 resulting from input at port 1.

$$I_{2,1}=r_{1u}^2r_{2u}^2+2r_{1u}r_{2v}r_{2u}r_{1v}\cos(2\psi+\phi_{1u}-\phi_{1v}-(\phi_{2u}-\phi_{2v})) \qquad (6)$$

The notation can be simplified by defining, up to a multiple of $2\pi$ ("mod $2\pi$")

$$\zeta_3=\phi_{1u}-\phi_{1v}-(\phi_{2u}-\phi_{2v})(\mathrm{mod}\ 2\pi) \qquad (7)$$

and similarly by cyclic interchange $$\zeta_1=\phi_{2u}-\phi_{2v}-(\phi_{3u}-\phi_{3v})(\mathrm{mod}\ 2\pi) \qquad (8)$$

$$\zeta_2=\phi_{3u}-\phi_{3v}-(\phi_{1u}-\phi_{1v})(\mathrm{mod}\ 2\pi) \qquad (9)$$

There are three ports (1, 2 and 3) which may be used for input to the 3×3 Sagnac system and in each of these three cases there are output intensities at each of the same three ports. There are altogether nine intensities $I_{ij}$ (i, j=1,2,3) and these may be derived similarly to the expression 6. The first index refers to the output port and the second to the input port. If the departures from ideality are small, we may write $$r_{in}=r_0(1+\rho_{in}),\ r_{iv}=r_0(1+\rho_{iv}),\ i=1,2,3 \qquad (10)$$

where $r_0$ is $$\sqrt{\frac{1}{3}}$$

and the $\rho$'s are small, and $$\zeta_i=\phi_0+\eta_i,\ i=1,2,3 \qquad (11)$$

where $\phi_0$ is either $+2\pi/3$ or $-2\pi/3$ and the $\eta$'s are small.

For an ideal coupler (i.e. lossless and splitting ratios one third) the three intensities $I_{1,2}, I_{2,3}$ and $I_{3,1}$, which are related by cyclic permutation of the subscripts, are equal, and in particular have the same relative phase shift which may be taken to be $-\phi_0$. Let us denote the average of these three "concordant" intensities by $I_-$ $$I_-=(I_{1,2}+I_{2,3}+I_{3,1})/3 \qquad (12)$$

We similarly define two other averages of concordant intensities, one where in the ideal case the phase shift is $+\phi_0$.

$$I_{30}=(I_{2,1}+I_{3,2}+I_{1,3})/3 \qquad (13)$$

and the other which in the ideal case has phase shift zero $$I_0=(I_{1,1}+I_{2,2}+I_{3,3})/3 \qquad (14)$$

We also define an average loss factor $\bar{\rho}$ $$\bar{\rho}=(\rho_{1u}+\rho_{2u}+\rho_{3u}+\rho_{1v}+\rho_{2v}+\rho_{3v})/6 \qquad (15)$$

We find, dropping all terms higher than first order in small quantities, $$I = \frac{2}{9}(1+4\bar{\rho})(1+\cos(2\psi+\varphi_0)) \qquad (16)$$

$$I = \frac{2}{9}(1+4\bar{\rho})(1+\cos(2\psi-\varphi_0)) \qquad (17)$$

$$I_0 = \frac{2}{9}(1+4\bar{\rho})(1+\cos(2\psi)) \qquad (18)$$

The last three equations show that the three averaged intensities have a functional dependence on the phase $\Psi$ which (to first order) is independent of the actual 3×3 coupler, and therefore independent of its deficiencies, apart from a trivial common factor. The equations 16, 17 and 18 are, apart from the common factor $1+4\bar{\rho}$, identical with the expressions for the three output intensities for an ideal 3×3 coupler (employing any one input port).

Figure 2:
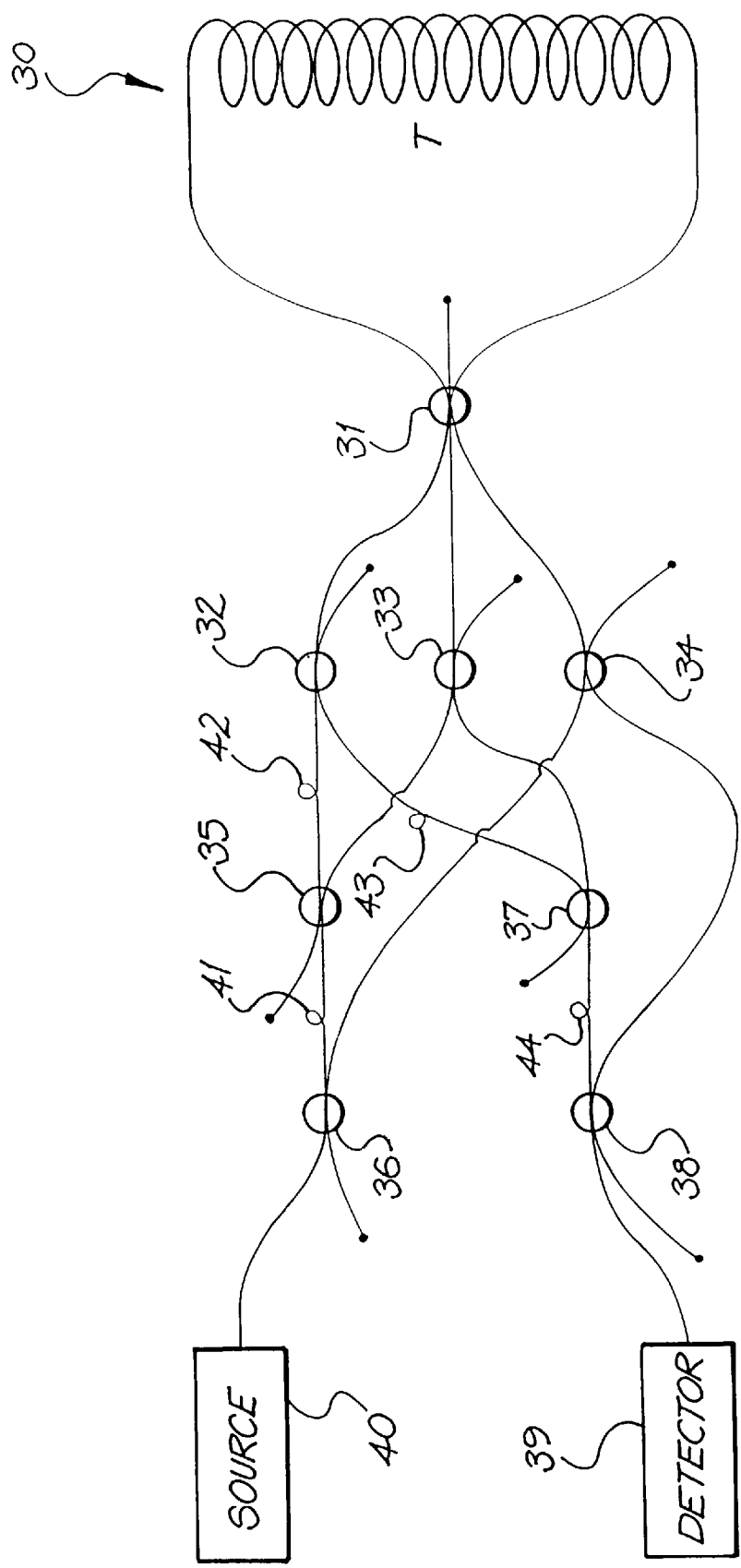
FIG. 2 illustrates schematically an arrangement of an embodiment of the invention.

One form of arrangement using the aforementioned principles is illustrated in FIG. 2. In this system, the Sagnac loop 30 is interconnected to a 3×3 coupler 31 which is in turn interconnected to input/output couplers 32–34. The couplers 32–34 are in turn connected by the couplers 35, 36, 37, 38. Hence, the output from optical source 40 is coupled by coupler 36 immediately to coupler arm 34 and after a delay by fibre delay loop 41 to coupler 35. The output from coupler 35 is immediately forwarded to coupler 33 and delayed by delay loop 42 before being sent to coupler 32. The outputs from the coupler 31 are again time delayed by means of delay loops 43, 44 so as to have a staggered temporal return to detector 39. In this manner, a pulsed output from source 40 can be temporally monitored at detector 39 to determine the summations.

In this manner, the Sagnac interferometer can be sequentially interrogated through each of the three inputs. The outputs are processed in the manner described.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

We claim:

1. A method of interrogating an optical coupler interconnected to a two beam interferometer, so as to determine an idealised output value, said optical coupler having at least three bidirectional external input/output ports, said method comprising the steps of:

for each of said external input/output ports:
  inserting an optical signal into the port;
  measuring a corresponding output at each of said ports;
forming summations of those corresponding outputs which, in an ideal coupler, would have equal intensities;
and determining said idealized output value of said coupler from said summations.

2. A method as claimed in claim 1, whereby the property of reciprocity is possessed by the summed outputs, whereby the signal is accurately zero when a measured current or rotation is zero.

3. A method as claimed in claims 1 or 2 wherein said optical coupler comprises a 3×3 coupler.

4. A method as claimed in any previous claim wherein each of said summations is formed from a corresponding output from each of the ports for a particular optical signal insertion.

5. A method as claimed in any previous claim wherein said two beam interferometer comprises a Sagnac interferometer.

6. A method as claimed in any previous claim wherein said summations are formed from a single optical pulse appropriately delayed so that said corresponding outputs arrive at a detector in a temporally spaced manner.

7. An apparatus for interrogating an optical coupler interconnected to a two beam interferometer, so as to determine an idealised output value, said optical coupler having at least three bidirectional external input/output ports, said apparatus comprising:

means for inserting optical signals into each of the ports;

means for measuring a corresponding output at each of said ports when an optical signal is inserted into one of the ports; and means for forming summations of those corresponding outputs which, in an ideal coupler, would have equal intensities.

8. An apparatus as claimed in claim 7, further comprising means for determining an idealised output value of the coupler from said summations.

* * * * *